United States Patent
Ji et al.

(10) Patent No.: US 11,756,795 B2
(45) Date of Patent: Sep. 12, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Shiliang Ji, Shanghai (CN); Panpan Liu, Shanghai (CN); Haiyang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 213 days.

(21) Appl. No.: 17/035,591

(22) Filed: Sep. 28, 2020

(65) Prior Publication Data
US 2021/0193479 A1    Jun. 24, 2021

(30) Foreign Application Priority Data
Dec. 23, 2019 (CN) .......................... 201911338309.0

(51) Int. Cl.
  *H01L 21/311*   (2006.01)
  *H01L 21/027*   (2006.01)
  *H01L 21/033*   (2006.01)

(52) U.S. Cl.
  CPC .... *H01L 21/31144* (2013.01); *H01L 21/0273* (2013.01); *H01L 21/0276* (2013.01);
  (Continued)

(58) Field of Classification Search
  CPC ........... H01L 21/0276; H01L 21/31116; H01L 21/0273; H01L 21/31144
  See application file for complete search history.

(56) References Cited

U.S. PATENT DOCUMENTS 6,867,063 B1 *  3/2005  Ghandehari ........ H01L 21/0276
                                                    438/69
7,585,780 B2 *  9/2009  Kim .................. H01L 28/90
                                                    438/725
(Continued)

FOREIGN PATENT DOCUMENTS

CN    109216164 A   *  1/2019   ......... H01L 21/0271
KR    20100011488 A  *  2/2010   ......... H01L 21/027
WO    WO-2022100070 A1 *  5/2022   ............. G03F 7/40

OTHER PUBLICATIONS

Ian M. Thomas, "Method for the preparation of porous silica antireflection coatings varying in refractive index from 1.22 to 1.44," Appl. Opt. 31, 6145-6149 (Year: 1992).*

(Continued)

*Primary Examiner* — Yara B Green
*Assistant Examiner* — Fakeha Sehar
(74) *Attorney, Agent, or Firm* — Anova Law Group, PLLC

(57) ABSTRACT

The present disclosure provides a method for forming a semiconductor structure. The method includes providing a target etching layer; sequentially forming an initial mask layer, an anti-reflection layer, and a patterned structure on the target etching layer; performing a first etching process on the anti-reflection layer to remove a surface portion of the anti-reflection layer using the patterned structure as a mask; performing a surface treatment process on the patterned structure; and performing a second etching process on the anti-reflection layer until exposing a surface of the initial mask layer.

15 Claims, 5 Drawing Sheets

(52) U.S. Cl.
CPC .... *H01L 21/0337* (2013.01); *H01L 21/31116* (2013.01); *H01L 21/31138* (2013.01); *H01L 21/0332* (2013.01)

(56) References Cited

U.S. PATENT DOCUMENTS

| | | | |
|---|---|---|---|
| 8,124,322 B2* | 2/2012 | Soda | H01L 21/31116 430/313 |
| 8,741,775 B2* | 6/2014 | Nemani | H01L 21/31116 438/699 |
| 9,543,163 B2* | 1/2017 | Ling | H01L 21/76802 |
| 9,905,754 B1* | 2/2018 | Yoon | H10N 50/01 |
| 10,354,874 B2* | 7/2019 | Huang | H01L 21/0337 |
| 10,539,874 B2* | 1/2020 | Roh | C09D 125/18 |
| 10,679,863 B2* | 6/2020 | Chen | H01L 21/76813 |
| 11,342,195 B1* | 5/2022 | Han | H01L 21/30655 |
| 2005/0153538 A1* | 7/2005 | Tsai | H01L 21/76807 257/E21.252 |
| 2006/0046483 A1* | 3/2006 | Abatchev | H01L 21/0331 438/689 |
| 2006/0166482 A1* | 7/2006 | Kanamura | H01L 21/76835 438/736 |
| 2007/0111110 A1* | 5/2007 | Lin | H01L 21/0273 430/5 |
| 2010/0216310 A1* | 8/2010 | Metz | H01L 21/31116 257/E21.24 |
| 2016/0064239 A1* | 3/2016 | Shih | H01L 21/0273 438/694 |
| 2018/0166285 A1* | 6/2018 | Lee | H01L 21/02266 |
| 2022/0037152 A1* | 2/2022 | Raley | H01L 21/0332 |
| 2022/0084833 A1* | 3/2022 | Sato | H01L 21/3081 |

OTHER PUBLICATIONS

Ian M. Thomas, "Method for the preparation of porous silica antireflection coatings varying in refractive index from 1.22 to 1.44," Appl. Opt. 31, 6145-6149, 1992.*

* cited by examiner

SEMICONDUCTOR STRUCTURE AND FABRICATION METHOD THEREOF

CROSS-REFERENCE TO RELATED APPLICATIONS

This application claims the priority of Chinese Patent Application No. CN201911338309.0, filed on Dec. 23, 2019, the entire content of which is incorporated herein by reference.

FIELD OF THE DISCLOSURE

The present disclosure generally relates to the field of semiconductor manufacturing and, more particularly, relates to semiconductor structures and fabrication methods thereof.

BACKGROUND

Semiconductor manufacturing processes often include a photolithography process and an etching process. In the photolithography process, the photoresist is spin-coated on a substrate, and the spin-coated photoresist is soft-baked to form a solid film. Further, the photoresist is exposed and developed to form a desired photolithography pattern in the photoresist. An etching process is then performed on the substrate using the photolithography pattern as a mask to transfer the photolithography pattern to the substrate.

As semiconductor manufacturing technology advances, semiconductor chips are moving towards higher level of integration in order to achieve higher operation speed, higher information storage capacity, etc. However, as the integration level of semiconductor chips becomes higher, the critical dimension (CD) of semiconductor structures becomes smaller. Because the photolithography process plays an important role in controlling the CD, as the CD becomes smaller, the photolithography process faces unprecedented challenges. The distance between the edges of the photolithography pattern formed after a photolithography process is called line width, and line width roughness (LWR) and line edge roughness (LER) are used as important measures of line width. To a certain extent, the LWR determines the line width of the CD, so the importance of LWR control has become increasingly apparent.

As the line width is gradually reduced, existing LWR may adversely affect the performance of semiconductor devices. The disclosed semiconductor structures and fabrication methods thereof are directed to solve one or more problems set forth above and other problems in the art.

BRIEF SUMMARY OF THE DISCLOSURE

One aspect of the present disclosure provides a method for forming a semiconductor structure. The method includes providing a target etching layer; sequentially forming an initial mask layer, an anti-reflection layer, and a patterned structure on the target etching layer; performing a first etching process on the anti-reflection layer to remove a surface portion of the anti-reflection layer using the patterned structure as a mask; performing a surface treatment process on the patterned structure; and performing a second etching process on the anti-reflection layer until exposing a surface of the initial mask layer.

Optionally, the surface treatment process performed on the patterned structure includes a plasma treatment process.

Optionally, the processing gas used in the plasma treatment process includes HBr, $H_2$, Ar, or a combination thereof.

Further, the processing gas includes HBr. The processing parameters used in the plasma treatment process include a flow rate of HBr in a range of approximately 30 sccm to 500 sccm; a pressure in a range of approximately 3 mTorr to 100 mTorr; and a power in a range of approximately 50 W to 1000 W.

Optionally, the anti-reflection layer is made of an inorganic anti-reflection material or an organic anti-reflection material.

Further, a thickness of the surface portion of the anti-reflection layer removed by the first etching process accounts for approximately 5% to 95% of the thickness of an entirety of the anti-reflection layer.

Optionally, each of the first etching process and the second etching process includes a dry etching process.

Optionally, the processing parameters used in the first etching process and the second etching process are the same. The processing parameters of the first etching process and the second etching process include an etching gas including one or more of $CH_xF_y$ gases, where x and y are both natural numbers, x+y=4, and x=0, 1, 2, 3; an etching pressure in a range of approximately 5 mTorr to 100 mTorr; and an etching power in a range of approximately 100 W to 1200 W.

Optionally, the target etching layer is made of a low-K dielectric material or an ultra-low-K dielectric material, including SiOH, SiCOH, fluorosilicate glass (FSG), borosilicate glass (BSG), phosphosilicate glass (PSG), borophosphosilicate glass (BPSG), hydrogenated silsesquioxane (HSQ, $(HSiO_{1.5})_n$), or methylsilsesquioxane (MSQ, $(CH_3SiO_{1.5})_n$).

Optionally, the target etching layer is made of a dielectric material, including silicon oxide ($SiO_x$), silicon nitride ($SiN_x$); or a conductive material, including titanium nitride ($TiN_x$).

Optionally, the anti-reflection layer is made of an inorganic anti-reflection material, including silica, carbon-doped silica, nitrogen-doped silica, or a combination thereof.

Optionally, the anti-reflection layer is made of an organic anti-reflection material, including an unmodified organic anti-reflection material, or an organic anti-reflection material containing silicon or modified elements other than silicon.

Optionally, prior to performing the surface treatment process on the patterned structure, the roughness of the patterned structure is a first roughness; and after performing the surface treatment process on the patterned structure, the roughness of the patterned structure is a second roughness. The second roughness is less than the first roughness.

Optionally, after exposing the surface of the initial mask layer, the method further includes etching the initial mask layer using the patterned structure and the anti-reflection layer as an etch mask to form a patterned mask layer.

Further, etching the initial mask layer using the patterned structure and the anti-reflection layer as the etch mask includes a dry etching process. The processing parameters used in the dry etching process include an etching gas including sulfur dioxide and oxygen, or sulfur dioxide and nitrogen; a flow rate of the etching gas is a range of approximately 10 sccm to 500 sccm; an etching pressure in a range of approximately 10 mTorr to 50 mTorr; and an etching power in a range of approximately 100 W to 1200 W.

Optionally, after etching the initial mask layer to form the patterned mask layer, the method further includes etching the target etching layer using the patterned mask layer as an etch mask to form a target pattern layer.

Further, the target etching layer is made of silicon oxide ($SiO_x$) or silicon nitride ($SiN_x$); and etching the target etching layer includes a dry etching process. The processing parameters used in the dry etching process include an etching gas including one or more of $CH_xF_y$ gases, where x and y are both natural numbers, x+y=4, and x=0, 1, 2, 3; an etching pressure in a range of approximately 5 mTorr to 100 mTorr; and an etching power in a range of approximately 100 W to 1200 W.

Another aspect of the present disclosure provides a semiconductor structure. The semiconductor structure is formed by the method according to various embodiment of the present disclosure.

Compared to existing semiconductor structures and fabrication methods, the disclosed semiconductor structures and fabrication methods may demonstrate the following exemplary advantages.

According to the disclosed methods, prior to performing a surface treatment process on the patterned structure, a first etching process may be performed on the anti-reflection layer using the patterned structure as an etch mask to remove a surface portion of the anti-reflection layer. The surface treatment process mainly leads to regrowth of the molecules of the patterned structure, such that the patterned structure becomes smooth. However, the surface treatment process has limited effect on the anti-reflection layer. Therefore, the portion of the anti-reflection layer at the bottom of the patterned structure is used to fix the pitch of the patterned structure, preventing the patterned structure from changing the line width due to displacement after the surface treatment process. When subsequently transferring the morphology and size of the patterned structure after being surface treated to the target etching layer, the LWR of the pattern formed by etching is improved. In addition, the size of the pattern formed by etching may be ensured to be consistent with the expected target, such that the device performance of the semiconductor structure is improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the present disclosure, which are illustrated in the accompanying drawings. Wherever possible, the same reference numbers will be used throughout the drawings to refer to the same or like parts.

Figure 1:
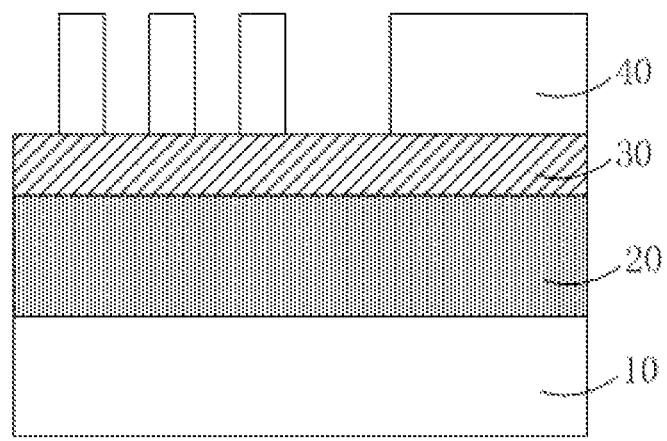
FIGS. 1-3 illustrate schematic cross-sectional views of semiconductor structures at certain stages of a fabrication process of a semiconductor structure.
Figure 2:
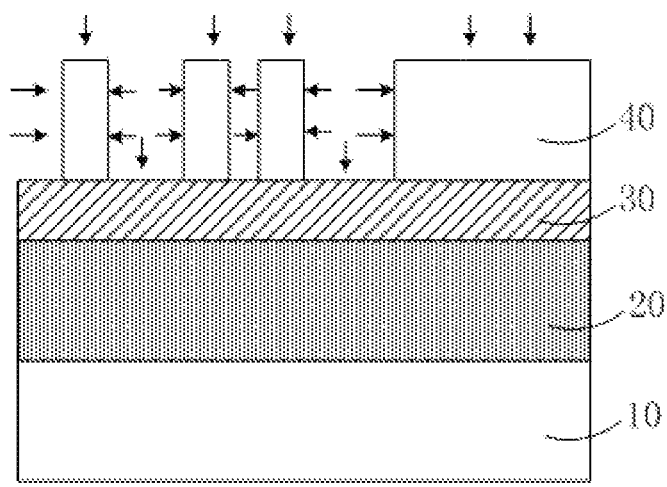
Figure 3:
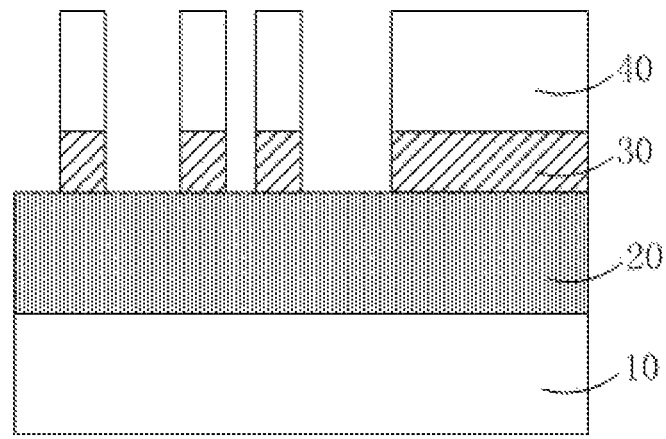

FIGS. 1-3 illustrate schematic cross-sectional views of semiconductor structures at certain stages of a fabrication process of a semiconductor structure.

Referring to FIG. 1, a to-be-etched layer 10 is provided. An initial mask layer 20 is formed on the to-be-etched layer 10, an anti-reflection layer 30 is formed on the initial mask layer 20, and a patterned structure 40 is formed on the anti-reflection layer 30.

Referring to FIG. 2, a surface treatment process is performed on the patterned structure 40 so that a first roughness of the patterned structure 40 becomes a second roughness. The second roughness is less than the first roughness.

Referring to FIG. 3, the anti-reflection layer 30 is etched using the patterned structure 40 as a mask until exposing the surface of the initial mask layer 20.

In a subsequent process, the initial mask layer 20 is etched using the patterned structure 40 and the anti-reflection layer 30 as a mask to form a patterned mask layer (not shown); and the to-be-etched layer 20 is then etched using the patterned mask layer as a mask to form an etched layer (not shown).

According to the semiconductor structure and fabrication method described above, the patterned structure 40 is first subjected to a surface treatment process. When performing the surface treatment process on the patterned structure 40, the surface treatment may be applied not only on the sidewall portion of the patterned structure 40, but also on the bottom portion of the patterned structure 40. The surface treatment process leads to regrowth of the molecules on the surface of the patterned structure 40, and thus reduce the roughness of the patterned structure 40. After the regrowth of the molecules at the bottom portion of the patterned structure 40 and the patterned structure 40 becoming smooth, the patterned structure 40 is likely displaced, which changes the line width of the patterned structure 40 (referring to FIGS. 1-2). In a subsequent process, when transferring the morphology and size of the patterned structure 40 after being surface treated to the to-be-etched layer 10, the formed patterned may be inconsistent with the target etching pattern, thereby degrading the device performance of the semiconductor structure.

The present disclosure provides a semiconductor structure and a method for forming the semiconductor structure. According to the disclosed method, a surface portion of the anti-reflection layer is removed using the patterned structure as a mask, and then a surface treatment process is performed on the patterned structure. As such, the surface treatment process on the patterned structure may be conducive to improving the LWR, and when the morphology of the patterned structure is subsequently transferred to the target etching layer, the LWR of the etched pattern may be improved. In addition, because the surface treatment process has limited effect on the anti-reflection layer, by keeping the bottom portion of the anti-reflection layer at the bottom of the patterned structure, the line width of the patterned structure may be fixed, thereby preventing the patterned structure from being displaced during the surface treatment process. As such, when the morphology and the size of the patterned structure are transferred to the target etching layer, large difference in the size between the etched pattern and the target pattern due to the change in the line width of the patterned structure may be avoided, thereby improving the device performance of the semiconductor structure.

To make the aforementioned objectives, features, and beneficial effects of the present disclosure more comprehensible, specific embodiments of the present disclosure are described in detail with reference to the accompanying drawings.

Figure 8:
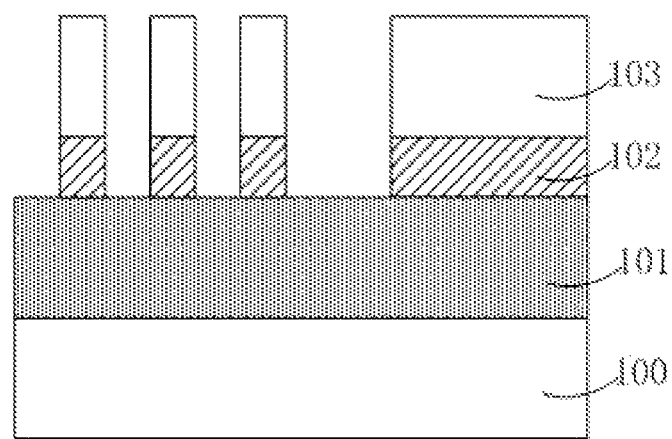
Figure 9:
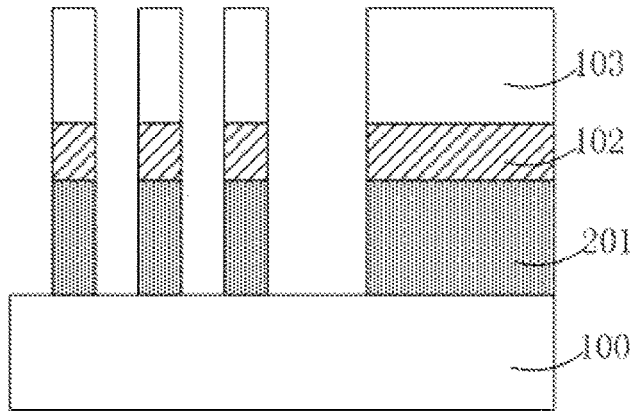
Figure 10:
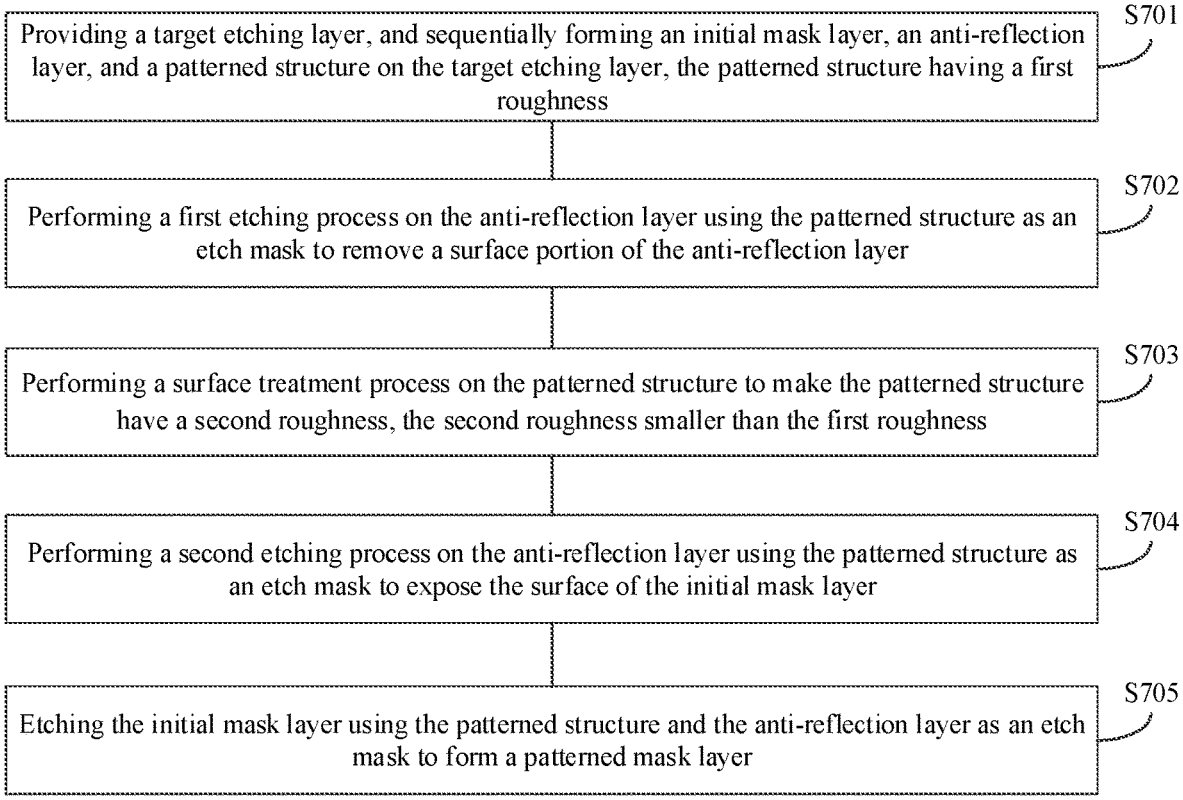
FIG. 10 illustrates a flowchart of an exemplary method for fabricating a semiconductor structure consistent with some embodiments of the present disclosure.

The present disclosure provides a method for forming a semiconductor structure. FIG. 10 illustrates a flowchart of an exemplary method for fabricating a semiconductor structure consistent with some embodiments of the present disclosure, and FIGS. 4-9 illustrate schematic views of semiconductor structures at certain stages of the exemplary method.

Figure 4:
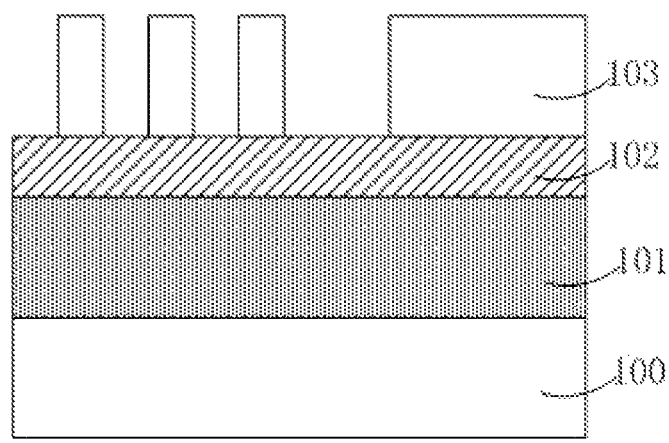
FIGS. 4-9 illustrate schematic views of semiconductor structures at certain stages of an exemplary method for fabricating a semiconductor structure consistent with some embodiments of the present disclosure.

Referring to FIG. 10, a target etching layer may be provided, and an initial mask layer, an anti-reflection layer, and a patterned structure may be sequentially formed on the target etching layer (S701). FIG. 4 illustrates a schematic cross-sectional view of a semiconductor structure consistent with various embodiments of the present disclosure.

Referring to FIG. 4, a target etching layer 100 may be provided. An initial mask layer 101, an anti-reflection layer 102, and a patterned structure 103 may be sequentially formed on the target etching layer 100.

In one embodiment, the target etching layer 100 may be made of a low-K dielectric material (referring to a material having a relative dielectric constant larger than or equal to 2.6, but smaller than 3.9), or an ultra-low-K dielectric material (referring to a material having a relative dielectric constant smaller than 2.6). When the target etching layer 100 is made of a low-K dielectric material or an ultra-low-K dielectric material, the material of the target etching layer 100 may be SiOH, SiCOH, fluorosilicate glass (FSG), borosilicate glass (BSG), phosphosilicate glass (PSG), borophosphosilicate glass (BPSG), hydrogenated silsesquioxane (HSQ, $(HSiO_{1.5})_n$), or methylsilsesquioxane (MSQ, $(CH_3SiO_{1.5})_n$). In one embodiment, the target etching layer 100 may be made of an ultra-low-K dielectric material, and the ultra-low-K dielectric material may be SiCOH.

In other embodiments, the target etching layer may be made of a dielectric material, such as silicon oxide ($SiO_x$), silicon nitride ($SiN_x$), or a conductive material, such as titanium nitride ($TiN_x$).

The process of forming the initial mask layer 101 may include spin-coating, low-temperature chemical vapor deposition (CVD), atomic layer deposition (ALD), or a combination thereof. In one embodiment, the initial mask layer 101 may be formed by spin-coating.

The anti-reflection layer 102 may be used to eliminate the influence of the standing wave caused by the reduced exposure accuracy during the exposure process for forming the patterned structure 103. In one embodiment, the anti-reflection layer 102 may be a developer-soluble anti-reflection layer.

In other embodiments, the anti-reflection layer may be a photosensitive soluble anti-reflection layer, also called a photoimageable anti-reflection layer. In one type of photosensitive soluble anti-reflection layer, the anti-reflection layer may become soluble in a developer after exposure; and in another type of photosensitive soluble anti-reflection layer, the anti-reflection layer 102 may become insoluble in the developer after exposure.

The anti-reflection layer 102 may be made of an inorganic anti-reflection material or an organic anti-reflection material. When the anti-reflection layer 102 is made of an inorganic anti-reflection material, the inorganic anti-reflection material may include silica, carbon-doped silica, nitrogen-doped silica, or a combination thereof. In one embodiment, the anti-reflection layer 102 may be made of silica.

When the anti-reflection layer 102 is made of an organic anti-reflection material, the anti-reflection layer 102 may be a silicon-containing anti-reflection layer, an organic anti-reflection layer containing modified other elements, or an organic anti-reflection layer without being modified. That is, the organic anti-reflection material may include an unmodified organic anti-reflection material, or an organic anti-reflection material containing silicon or modified elements other than silicon.

In one embodiment, the anti-reflection layer may be formed by a CVD process. In other embodiments, when the anti-reflection layer is made of an organic anti-reflection material, the anti-reflection layer may be formed on the initial mask layer by a spin-coating process.

In one embodiment, the patterned structure 103 may be a patterned photoresist layer, and the roughness of the patterned photoresist layer may be a first roughness. In one embodiment, the first roughness may be a first LWR. The patterned photoresist layer may be made of a positive photoresist or a negative photoresist.

In one embodiment, forming the patterned photoresist layer may include the following exemplary steps. An initial photoresist film (not shown) may be formed on the anti-reflection layer 102 by a spin-coating process. The initial photoresist film may then be subjected to exposure and development to form the patterned photoresist layer.

In one embodiment, the patterned structure 103 may be used to define the morphology and the size of the target etching layer for subsequent etching. In a subsequent process, the morphology and the size of the patterned structure 103 may be transferred to the target etching layer 100.

Figure 5:
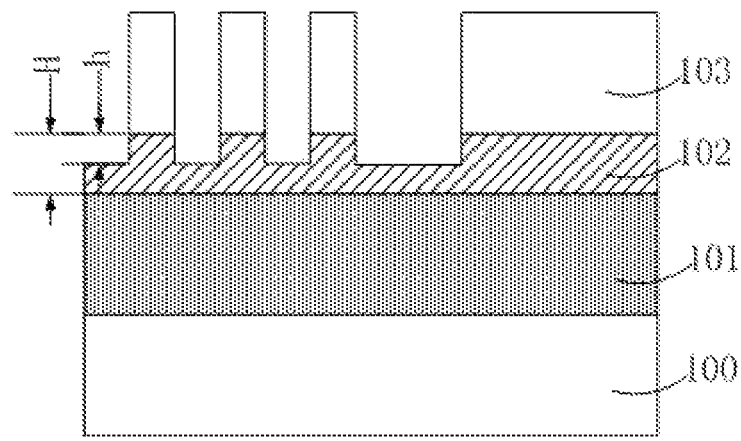

Further, returning to FIG. 10, a first etching process may be performed on the anti-reflection layer using the patterned structure as an etch mask to remove a surface portion of the anti-reflection layer (S702). FIG. 5 illustrates a schematic cross-sectional view of a semiconductor structure consistent with various embodiments of the present disclosure.

Referring to FIG. 5, a first etching process may be performed on the anti-reflection layer 102 using the patterned structure 103 as an etch mask to remove a surface portion of the anti-reflection layer 102. For example, in one embodiment, the thickness of the portion of the anti-reflection layer 102 removed by the first etching process is h, the thickness of the entirety of the anti-reflection layer 102 is H, and the ratio of h to H may be in a range of approximately 5% to 95%. That is, the thickness of the surface portion of the anti-reflection layer 102 removed in the first etching process may account for approximately 5% to 95% of the entire thickness of the anti-reflection layer 102.

In one embodiment, the reason to remove a surface portion of the anti-reflection layer 102 and then perform the surface treatment process may include the following. The surface treatment process may lead to re-growth of the molecules on the sidewall and bottom surfaces of the patterned structure 103, which may easily cause the patterned structure 103 to be displaced. However, the surface treatment process has limited influence on the molecules on the surface of the anti-reflection layer 102. Therefore, a surface portion of the anti-reflection layer 102 is removed to transfer the line width of the patterned structure 103 to the anti-reflection layer 102, and then during the surface treatment process, the anti-reflection layer 102 may be able to keep the line width unchanged. In a subsequent process, the line width may be transferred to the target etching layer 100 to ensure that the size of the obtained pattern matches that of the target pattern.

When the thickness of the portion of the anti-reflection layer 102 removed in the first etching process is overly large and the thickness of the remaining portion of the anti-reflection layer 102 is too small, after the surface treatment process, the morphology of the patterned structure 103 with improved LWR may not be well transferred to the target etching layer. As such, the LWR of the pattern formed after etching may not be improved. When the thickness of the portion of the anti-reflection layer 102 removed in the first etching process is too small, changes of the patterned structure 103, such as displacement, during the surface treatment process may still be possible, which may further cause the size of the pattern formed after etching to be inconsistent with the expected size. Therefore, in one embodiment, the thickness of the surface portion of the anti-reflection layer 102 removed in the first etching process may account for approximately 5% to 95% of the thickness of the entirety of the anti-reflection layer 102. That is, the ratio of the thickness of the surface portion of the anti-reflection layer 102 removed in the first etching process to the entire thickness of the anti-reflection layer 102 may be in a range of approximately 5% to 95%.

In one embodiment, the first etching process may include a dry etching process, and the processing parameters used in the dry etching process may include an etching gas including one or more of $CH_xF_y$ gases; an etching pressure in a range of approximately 5 mTorr to 100 mTorr; and an etching power in a range of approximately 100 W to 1200 W. In one embodiment, x and y are both natural numbers, and x+y=4, where x=0, 1, 2, 3. That is, the one or more of $CH_xF_y$ gases may include $CF_4$, $CHF_3$, $CH_2F_2$, $CH_3F$, or a combination thereof.

Figure 6:
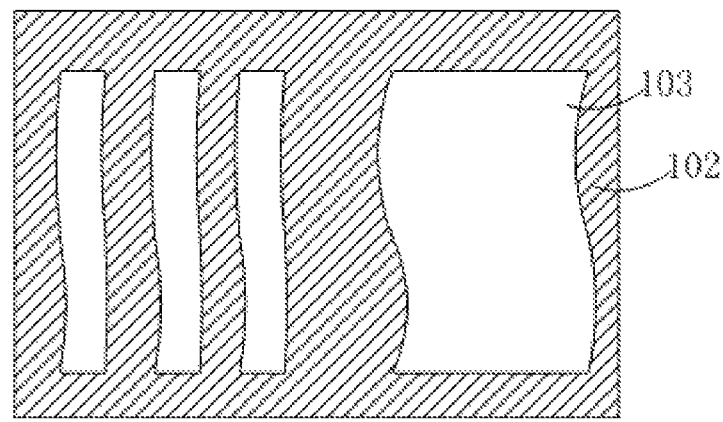

FIG. 6 illustrates a schematic plane view of the patterned structure shown in FIG. 5, Referring to FIG. 6, prior to the surface treatment process, the roughness of the patterned structure 103 may be a first roughness.

Figure 7:
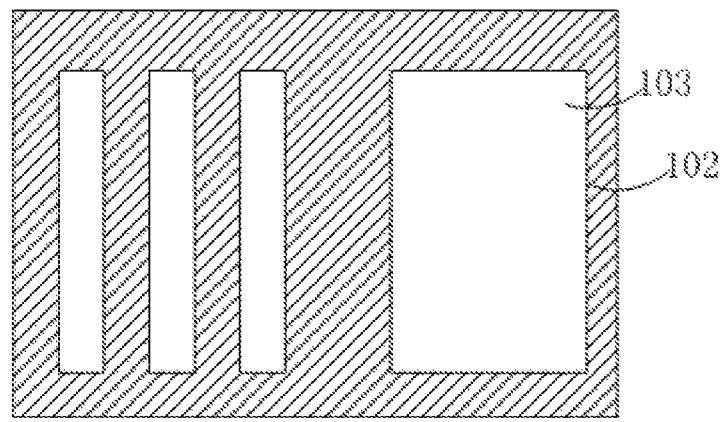

Further, returning to FIG. 10, after performing the first etching process on the anti-reflection layer, a surface treatment process may be performed on the patterned structure, such that the first roughness of the patterned structure may become a second roughness, which is less than the first roughness (S703). FIG. 7 illustrates of a schematic plane view of an exemplary semiconductor structure consistent with various embodiments of the present disclosure.

Referring to FIG. 7, after performing the first etching process on the anti-reflection layer 102, a surface treatment process may be performed on the patterned structure 103. After the surface treatment process, the first roughness of the patterned structure 103 may become a second roughness, and the second roughness may be less than the first roughness.

In one embodiment, by performing a surface treatment process on the patterned structure 103, the LWR of the patterned structure 103 may be improved. Therefore, after performing the surface treatment process, transferring the morphology of the patterned structure 103 to the target etching layer 100 may be beneficial to improving the LWR of the patterned structure obtained after etching, thereby conducive to improving the electrical performance of the semiconductor structure.

In one embodiment, the surface treatment process may be a plasma treatment process. The plasma treatment process may generate plasma and excite ultraviolet light and heat during the plasma formation process. The processing gas used in the plasma treatment process may include HBr, $H_2$, Ar, or a combination thereof.

In one embodiment, the processing gas used in the plasma treatment process may include HBr. In HBr plasma, ultraviolet light may be able to change the molecular structure on the surface of the patterned structure 103, thereby reducing the glass transition temperature of the patterned structure 103. As such, the surface molecules of the patterned structure 103 may reflow locally to produce a flattening effect, thereby reducing the LWR.

In one embodiment, the processing parameters used in the plasma treatment process may include a flow rate of HBr in a range of approximately 30 sccm to 500 sccm; a processing pressure in a range of approximately 3 mTorr to 100 mTorr; and a power in a range of approximately 50 W to 1000 W.

Further, returning to FIG. 10, after performing the surface treatment process, a second etching process may be performed on the anti-reflection layer until the surface of the initial mask layer is exposed (S704). FIG. 8 illustrates a schematic cross-sectional view of a semiconductor structure consistent with various embodiments of the present disclosure.

Referring to FIG. 8, after performing the surface treatment process, a second etching process may be performed on the anti-reflection layer 102 until the surface of the initial mask layer 101 is exposed.

In one embodiment, the second etching process may include a dry etching process, and the processing parameters used in the second etching process may be the same as the processing parameters used in the first etching process. For example, the processing parameters used in the second etching process may include an etching gas including one or more of $CH_xF_y$ gases, where x and y are both natural numbers, x+y=4, and x=0, 1, 2, 3; an etching pressure in a range of approximately 5 mTorr to 100 mTorr; and an etching power in a range of approximately 100 W to 1200 W.

In one embodiment, after performing the surface treatment process on the patterned structure 103, the remaining portion of the anti-reflection layer 103 may then be etched, such that the patterned structure with improved LWR after the surface treatment process may be transferred to the remaining portion of the anti-reflection layer 102, and may be further transferred to the target etching layer. As such, the LWR of the pattern formed after etching may be improved.

Further, returning to FIG. 10, after exposing the surface of the initial mask layer, the initial mask layer may be etched using the patterned structure and the anti-reflection layer as an etch mask to form a patterned mask layer (S705). FIG. 9 illustrates a schematic cross-sectional view of a semiconductor structure consistent with various embodiments of the present disclosure.

Referring to FIG. 9, after the surface of the initial mask layer 101 is exposed, the initial mask layer 101 may be etched using the patterned structure 103 and the anti-reflection layer 102 as an etch mask to form a patterned mask layer 201.

In one embodiment, etching the initial mask layer 101 may include a dry etching process, and the processing parameters used in the dry etching process may include an etching gas including sulfur dioxide and oxygen, or sulfur dioxide and nitrogen; a flow rate of the etching gas in a range of approximately 10 sccm to 500 sccm; an etching pressure in a range of approximately 10 mTorr to 50 mTorr; and an etching power in a range of approximately 100 W to 1200 W.

In one embodiment, after forming the patterned mask layer 201, the target etching layer 100 may be further etched using the patterned mask layer 201 as an etch mask to form a target pattern layer (not shown). The etching process performed to etch the target etching layer 100 may be selected according to the material of the target etching layer 100.

In one embodiment, the target etching layer 100 may be made of silicon oxide ($SiO_x$) or silicon nitride ($SiN_x$), the target etching layer 100 may be etched by a dry etching process, and the processing parameters of the dry etching process may include an etching gas including one or more of $CH_xF_y$ gases, where x and y are both natural numbers, x+y=4, and x=0, 1, 2, 3; an etching pressure in a range of approximately 5 mTorr to 100 mTorr; and an etching power in a range of approximately 100 W to 1200 W.

In one embodiment, the morphology and the line width of the patterned structure 103 may be transferred to the target etching layer 100 through the anti-reflection layer 102 and the patterned mask layer 201. As such, the LWR of the target pattern layer formed after etching may be improved, and in the meantime, the line width may be consistent with the preset line width, thereby improving the performance of the semiconductor structure.

Correspondingly, the present disclosure also provides a semiconductor structure fabricated by a method consistent with various embodiments of the present disclosure.

Compared to existing semiconductor structures and fabrication methods, the disclosed semiconductor structures and fabrication methods may demonstrate the following exemplary advantages.

According to the disclosed methods, prior to performing a surface treatment process on the patterned structure, a first etching process may be performed on the anti-reflection layer using the patterned structure as an etch mask to remove a surface portion of the anti-reflection layer. The surface treatment process mainly leads to regrowth of the molecules of the patterned structure, such that the patterned structure becomes smooth. However, the surface treatment process has limited effect on the anti-reflection layer. Therefore, the portion of the anti-reflection layer at the bottom of the patterned structure is used to fix the pitch of the patterned structure, preventing the patterned structure from changing the line width due to displacement after the surface treatment process. When subsequently transferring the morphology and size of the patterned structure after being surface treated to the target etching layer, the LWR of the pattern formed by etching is improved. In addition, the size of the pattern formed by etching may be ensured to be consistent with the expected target, such that the performance of the semiconductor structure is improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor structure, comprising:
    providing a target etching layer;
    sequentially forming an initial mask layer, an anti-reflection layer, and a patterned structure on the target etching layer;
    prior to performing a plasma treatment process on the patterned structure, performing, using the patterned structure as a mask, a first etching process on the anti-reflection layer to remove only surface portions of the anti-reflection layer to form recesses in the anti-reflection layer exposed by the patterned structure, wherein unexposed portions of the anti-reflection layer provide a fixed pitch under the patterned structure;
    performing the plasma treatment process on the recessed anti-reflection layer and on the patterned structure to provide the patterned structure with an improved line width roughness;
    after the plasma treatment process performed on the patterned structure, performing a second etching process on the anti-reflection layer through the recesses in the anti-reflection layer, until exposing a surface of the initial mask layer; and
    etching, using the patterned structure with the improved line width roughness and the unexposed portions of the anti-reflection layer with the fixed pitch as an etch mask, the initial mask layer to form a patterned mask layer.

2. The method according to claim 1, wherein:
a processing gas used in the plasma treatment process includes HBr, $H_2$, Ar, or a combination thereof.

3. The method according to claim 2, wherein:
the processing gas includes HBr; and
processing parameters used in the plasma treatment process include:
    a flow rate of HBr in a range of approximately 30 sccm to 500 sccm;
    a pressure in a range of approximately 3 mTorr to 100 mTorr; and
    a power in a range of approximately 50 W to 1000 W.

4. The method according to claim 1, wherein:
a thickness of the surface portion of the anti-reflection layer removed by the first etching process accounts for approximately 5% to 50% of a thickness of an entirety of the anti-reflection layer.

5. The method according to claim 1, wherein:
each of the first etching process and the second etching process includes a dry etching process.

6. The method according to claim 5, wherein:
processing parameters used in the first etching process and the second etching process are same, wherein the processing parameters of the first etching process and the second etching process include:
    an etching gas including one or more of $CH_xF_y$ gases, where x and y are both natural numbers, x+y=4, and x=0, 1, 2, 3;
    an etching pressure in a range of approximately 5 mTorr to 100 mTorr; and
    an etching power in a range of approximately 100 W to 1200 W.

7. The method according to claim 1, wherein:
the target etching layer is made of a low-K dielectric material or an ultra-low-K dielectric material, including SiOH, SiCOH, fluorosilicate glass (FSG), borosilicate glass (BSG), phosphosilicate glass (PSG), borophosphosilicate glass (BPSG), hydrogenated silsesquioxane (HSQ, $(HSiO_{1.5})_n$), or methylsilsesquioxane (MSQ, $(CH_3SiO_{1.5})_n$).

8. The method according to claim 1, wherein:
the target etching layer is made of a dielectric material, including silicon oxide ($SiO_x$), silicon nitride ($SiN_x$), or a conductive material, including titanium nitride ($TiN_x$).

9. The method according to claim 1, wherein:
the anti-reflection layer is made of an inorganic anti-reflection material, including silica, carbon-doped silica, nitrogen-doped silica, or a combination thereof.

10. The method according to claim 1, wherein:
the anti-reflection layer is made of an organic anti-reflection material, including an unmodified organic anti-reflection material, or an organic anti-reflection material containing silicon or modified elements other than silicon.

11. The method according to claim 1, wherein:
prior to performing the plasma treatment process on the patterned structure, a roughness of the patterned structure is a first roughness; and
after performing the plasma treatment process on the patterned structure, the roughness of the patterned structure is a second roughness, wherein:
the second roughness is less than the first roughness.

12. The method according to claim 1, wherein:
etching the initial mask layer using the patterned structure and the anti-reflection layer as the etch mask includes a dry etching process, wherein processing parameters used in the dry etching process include:
an etching gas including sulfur dioxide and oxygen, or sulfur dioxide and nitrogen;
a flow rate of the etching gas is in a range of approximately 10 sccm to 500 sccm;
an etching pressure in a range of approximately 10 mTorr to 50 mTorr; and
an etching power in a range of approximately 100 W to 1200 W.

13. The method according to claim 1, further including:
etching the target etching layer using the patterned mask layer as an etch mask to form a target pattern layer without removing the unexposed portions of the anti-reflection layer with the fixed pitch.

14. The method according to claim 13, wherein:
the target etching layer is made of silicon oxide ($SiO_x$) or silicon nitride ($SiN_x$); and
etching the target etching layer includes a dry etching process, wherein processing parameters used in the dry etching process include:
an etching gas including one or more of $CH_xF_Y$ gases, where x and y are both natural numbers, x+y=4, and x=0, 1, 2, 3;
an etching pressure in a range of approximately 5 mTorr to 100 mTorr; and
an etching power in a range of approximately 100 W to 1200 W.

15. A semiconductor structure formed by the method according to claim 1.

* * * * *